United States Patent
Hwangbo et al.

(10) Patent No.: US 7,057,609 B2
(45) Date of Patent: Jun. 6, 2006

(54) ELECTROMAGNETIC INTERFERENCE PREVENTION APPARATUS FOR FLAT PANEL DISPLAY

(75) Inventors: Sang Kyu Hwangbo, Seoul (KR); Joon Young Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 594 days.

(21) Appl. No.: 10/135,841

(22) Filed: May 1, 2002

(65) Prior Publication Data

US 2002/0172029 A1 Nov. 21, 2002

(30) Foreign Application Priority Data

May 2, 2001 (KR) .......................... 2001/0023796

(51) Int. Cl.
*G09G 3/00* (2006.01)

(52) U.S. Cl. ........................ 345/204; 345/55; 345/213; 315/85; 348/819

(58) Field of Classification Search ........ 345/211–215, 345/204, 55; 315/85; 348/819
See application file for complete search history.

(56) References Cited

U.S. PATENT DOCUMENTS

| | | | | |
|---|---|---|---|---|
| 5,359,343 A | * | 10/1994 | Nakamura | 345/100 |
| 5,437,060 A | * | 7/1995 | Delamater et al. | 455/63.1 |
| 5,631,920 A | * | 5/1997 | Hardin | 373/130 |
| 5,659,339 A | * | 8/1997 | Rindal et al. | 345/212 |
| 5,757,338 A | * | 5/1998 | Bassetti et al. | 345/3.2 |
| 6,046,646 A | * | 4/2000 | Lo et al. | 331/10 |
| 6,046,735 A | * | 4/2000 | Bassetti et al. | 345/204 |
| 6,097,437 A | * | 8/2000 | Hwang | 348/441 |
| 6,674,491 B1 | * | 1/2004 | Tsou | 348/819 |
| 6,720,943 B1 | * | 4/2004 | Kim et al. | 345/87 |

FOREIGN PATENT DOCUMENTS

JP 09-098152 4/1997

\* cited by examiner

*Primary Examiner*—Lun-yi Lao
(74) *Attorney, Agent, or Firm*—Fleshner & Kim, LLP

(57) ABSTRACT

An electromagnetic interference (EMI) prevention apparatus for a flat panel display which is capable of modulating the frequency of an input clock signal using a spread spectrum clocking method to increase the frequency of the clock signal and reduce the amplitude thereof so as to reduce EMI by a clock signal generated from a format converter of the flat panel display. The amount of electromagnetic energy radiated from a signal source of the flat panel display can be reduced to eradicate the root of an EMI problem, thus excluding the use of a conventional shielding plate or device.

9 Claims, 2 Drawing Sheets

FIG.1
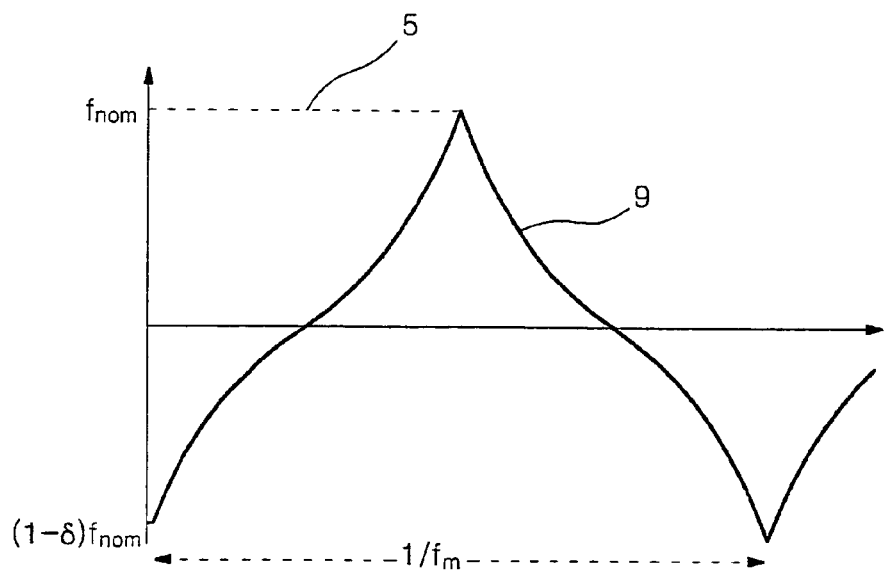
FIG. 2  "RELATED ART"
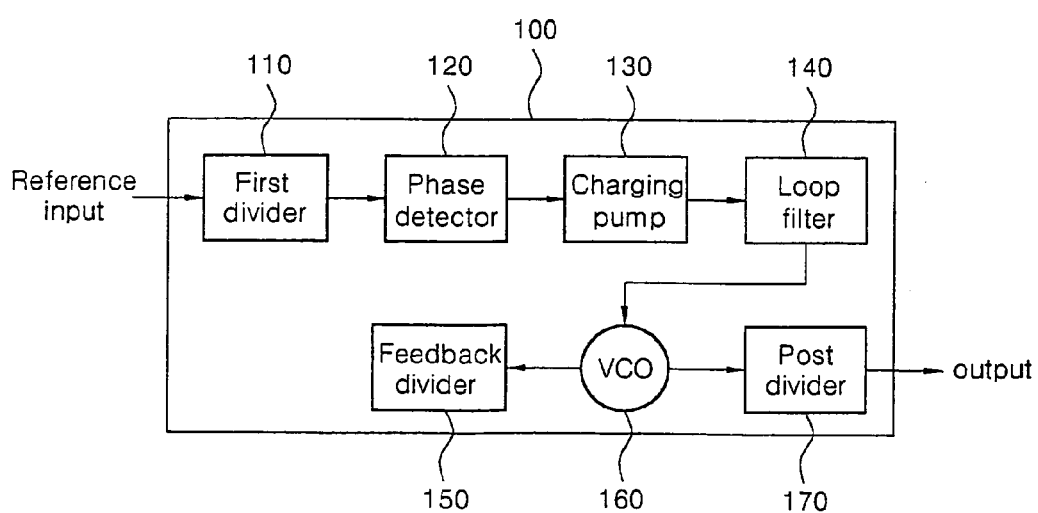

ELECTROMAGNETIC INTERFERENCE PREVENTION APPARATUS FOR FLAT PANEL DISPLAY

BACKGROUND OF THE INVENTION

1. Field of the Invention

The present invention relates to an electromagnetic interference (EMI) prevention apparatus, and more particularly to an EMI prevention apparatus for a flat panel display which is capable of minimizing EMI by a clock signal generated from a format converter of the flat panel display using a spread spectrum clocking method.

2. Description of the Related Art

It is common practice that most electric energy using devices generate a certain amount of electromagnetic noise, which is transferred in the form of electromagnetic radiation over the air or in the form of electromagnetic conduction over a conductor such act a power line.

Electromagnetic interference (EMI) is basically generated by three elements: a noise source for emitting electromagnetic energy in the form of electromagnetic conduction or radiation; a propagation medium for transferring the emitted electromagnetic energy; and damaged equipment subject to interference by noise. The EMI is not generated if any one of the three elements is excluded.

The EMI damages a variety of elements, such as communication equipment, control facilities, computer devices, human beings, etc. Effects of the EMI depend on a noise intensity, a transfer path, a distance from a noise source to damaged equipment, a coupled structure of the noise source and damaged equipment, and a resisting force of the damaged equipment.

Conventional EMI removal methods are generally adapted to reduce EMI by using a coaxial cable and a shielded line and mounting a shielding cover to given equipment, or by using a specific device capable of reducing the EMI.

However, such conventional methods are disadvantageous in that the use of additional elements for EMI reduction increases the cost and weight of given equipment.

In order to overcome the above problem, a spread spectrum clocking (SSC) scheme has been proposed for EMI reduction.

The SSC scheme is adapted to modulate the frequency of a clock signal according to a modulation profile of a predetermined frequency to increase the frequency of the clock signal and reduce the amplitude thereof, so as to reduce EMI.

FIG. 1 shows a modulation profile of a general spread spectrum clocking (SSC) method.

As shown in FIG. 1, according to the general SSC method, the frequency of a clock signal is modulated between a nominal frequency fnom 5 of a constant frequency clock signal and a down-spreading frequency (1-δ) fnom according to a modulation profile 9. Here, δ represents a spreading magnitude as a percentage of the nominal frequency fnom 5. The modulation profile 9 determines an energy distribution shape of a clock spectrum based on the spread spectrum clocking.

FIG. 2 is a block diagram of a general spread spectrum clocking (SSC) system, which is denoted by the reference numeral 100.

A description will hereinafter be given of the construction of the general SSC system 100 with reference to FIG. 2.

The general SSC system 100 comprises a first divider 110 for receiving a non-modulated input clock signal, a phase detector 120 for receiving an output signal from the first divider 110, which is a non-modulated input clock signal, and an input signal to a feedback divider 150, which is a frequency-modulated clock signal, measuring a phase difference between the non-modulated input clock signal and the frequency-modulated clock signal and providing the measured phase difference as its output signal, a charging pump 130 for receiving the output signal from the phase detector 120 and generating charges in response to the received signal, and a loop filter 140 for receiving the charges from the charging pump 130 and generating a direct current (DC) voltage output. The SSC system 100 further comprises the feedback divider 150, a voltage controlled oscillator (VCO) 160 and a post divider 170.

In the general SSC system 100 with the above-mentioned construction, the initial input clock signal, not modulated, is frequency-modulated according to a modulation profile. As a result, owing to the frequency modulation, the amplitude of the input clock signal is reduced while the frequency thereof is increased, thereby preventing EMI.

The SSC scheme as described above is applied to a computer system to increase the frequency of a clock signal for a high-speed process of a computer and reduce the amplitude thereof so as to reduce EMI, but it is not applied to a flat panel display.

In order to remove EMI with a flat panel display, there have conventionally been proposed a method for reducing the amount of electromagnetic energy conducted or radiated from a signal source itself, a method for reducing the amount of electromagnetic energy generated on a transfer path, and a method for protecting object equipment to be damaged, from EMI.

The first or third method may use a shielding plate to minimize EMI, and the second method may use a coaxial cable or a shielded conductor to minimize EMI.

However, the method using the shielding plate or coaxial cable is a passive method in that it interrupts radiated electromagnetic waves.

Provided that the amount of electromagnetic waves conducted or radiated from an EMI source can first be reduced, a necessity for using a separate shielding structure or device in a signal source, transfer path or object equipment will be removed.

SUMMARY OF THE INVENTION

Therefore, the present invention has been made in view of the above problems, and it is an object of the present invention to provide an electromagnetic interference (EMI) prevention apparatus for a flat panel display which is capable of modulating the frequency of an input clock signal using a spread spectrum clocking method to increase the frequency of the clock signal and reduce the amplitude thereof so as to reduce EMI by a clock signal generated from a format converter of the flat panel display.

It is another object of the present invention to provide an EMI prevention apparatus for a flat panel display which is capable of applying a spread spectrum clocking method to a format converter of the flat panel display to eradicate the root of an EMI problem with the format converter.

It is yet another object of the present invention to provide an EMI prevention apparatus for a flat panel display which is capable of reducing the amount of electromagnetic energy radiated from a signal source of the flat panel display to eradicate the root of an EMI problem, thus excluding the use of a conventional shielding plate or device.

In accordance with the present invention, the above and other objects can be accomplished by the provision of an electromagnetic interference prevention apparatus for a flat panel display comprising: clock generation means for generating a reference clock signal; spread spectrum clocking means for receiving the reference clock signal generated by the clock generation means and modulating a frequency of the received reference clock signal according to a modulation profile of a predetermined frequency; and data processing means for receiving an output clock signal from the spread spectrum clocking means and performing a predetermined data process in responses to the received clock signal.

Preferably, the clock generation means may be an external oscillator, and the data processing means may be a format converter. The format converter may receive the output clock signal from the spread spectrum clocking means as a reference clock signal for a phase lock loop therein and output a modified clock signal synchronized with input data.

The technical concept of the present invention that applies a spread spectrum clocking scheme to a flat panel display will be able to be extensibly applied to not only a format converter of the flat panel display but also any other means of the display. For the convenience of description and better understanding of the present invention, the case of applying the spread spectrum clocking scheme to the format converter will be described as an embodiment.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a view showing a modulation profile of a general spread spectrum clocking method;

FIG. 2 is a block diagram of a general spread spectrum clocking system;

DESCRIPTION OF THE PREFERRED EMBODIMENTS

Figure 3:
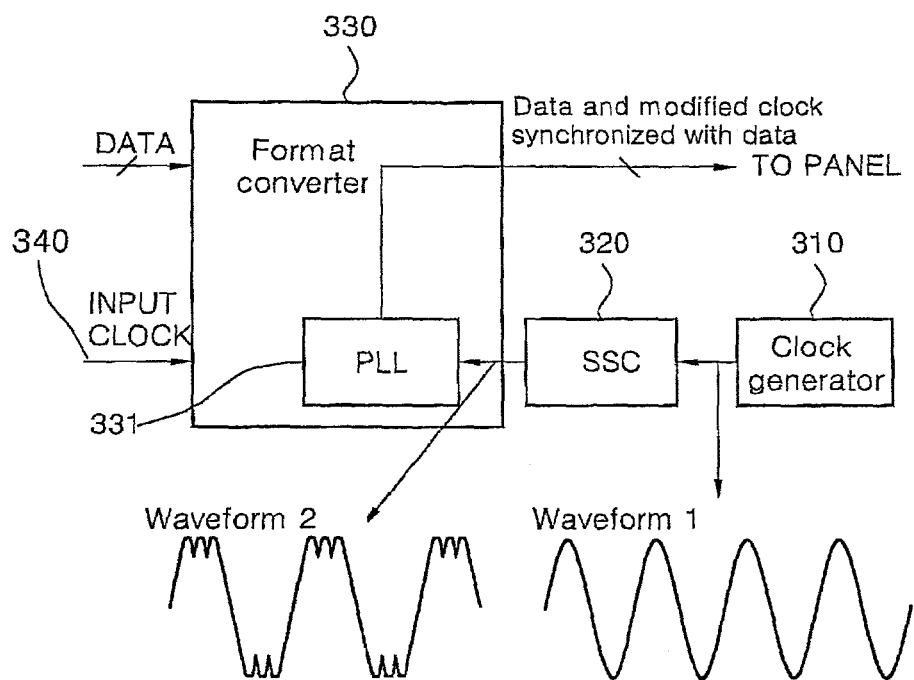
FIG. 3 is a block diagram showing the construction of an electromagnetic interference (EMI) prevention apparatus for a flat panel displays in accordance with the present invention.

With reference to FIG. 3, there is shown in block form the construction of an electromagnetic interference (EMI) prevention apparatus for a flat panel display in accordance with the present invention.

A description will hereinafter be given of the construction of the EMI prevention apparatus for the flat panel display in accordance with the present invention with reference to FIG. 3.

The EMI prevention apparatus for the flat panel display according to the present invention comprises a clock generator 310 for generating a clock signal, a spread spectrum clocking (SSC) unit 320 for modulating the clock signal generated by the clock generator 310, and a format converter 330 including a phase lock loop (PLL) 331 for synchronizing the clock signal modulated by the SSC unit 320 with an input clock signal 340 at a predetermined frequency and outputting input data as a signal of the predetermined frequency.

Next, the operation of the EMI prevention apparatus for the flat panel display with the above-mentioned construction in accordance with the present invention will be described in detail.

The clock generator 310 functions to generate a clock signal, and may preferably be an oscillator.

The clock signal generated by the clock generator 310 has a waveform 1 as shown in FIG. 3. This clock signal acts as a reference clock signal with respect to an internal clock signal of the system. The PLL 331 receives the clock signal from the clock generator 310, scales input data on the basis of the received clock signal and provides the scaled data as the output of the format converter 330.

The SSC unit 320 is connected between the output of the clock generator 310 and the input of the PLL 331, and has the same construction His that of the general SSC system shown in FIG. 2.

That is, the SSC unit 320 includes the first divider 110, phase detector 120, charging pump 130, loop filter 140, feedback divider 150, voltage controlled oscillator (VCO) 160 and post divider 170.

The SSC unit 320 with the above-mentioned construction is operated in the following manner.

The first divider 110 receives a non-modulated input clock signal, or the clock signal generated by the clock generator 310.

The phase detector 120 receives an output signal from the first divider 110, which is a non-modulated input clock signal, and an input signal to the feedback divider 150, which is a frequency-modulated clock signal, measures a phase difference between the non-modulated input clock signal and the frequency-modulated clock signal and provides the measured phase difference as its output signal.

The charging pump 130 receives the output signal from the phase detector 120 and generates charges in response to the received signal.

The loop filter 140 receives the charges from the charging pump 130 arid generates a DC voltage output.

The DC voltage output from the loop filter 140 is received by the VCO 160.

The VCO 160 then provides its output signal to both the post divider 170 and feedback divider 150.

Through these procedures, the post divider 170 generates and outputs the frequency-modulated clock signal.

The clock signal generated by the post divider 170 has a frequency modulated between the nominal frequency fnom 5 of the constant frequency clock signal and the down-spreading frequency (1-δ) fnom according to the modulation profile 9 of the SSC method shown in FIG. 1.

Namely, the output signal (waveform 1) from the clock generator 310 is frequency-modulated between the nominal frequency of the constant frequency clock signal and the down-spreading frequency by the SSC unit 320 and then inputted to the format converter 330.

As a result, the output signal from the clock generator 310 is frequency-modulated by the SSC unit 320 from the waveform 1 to a waveform 2, which is then inputted to the PLL 331 in the format converter 330. Consequently, the format converter 330 generates the frequency-modulated clock signal with no EMI.

Therefore, the EMI prevention apparatus for the flat panel display according to the present invention can root out an EMI problem with the format converter that causes severe EMI by processing a large amount of energy at a high clock frequency to format (convert) data.

The format converter 330 is also called a scaler. This format converter 330 functions to convert the format of video signal data to be displayed on the flat panel display (FPD) into that appropriate to the display. The converter 330 typically receives an output signal from a VGA as its input and converts the format of the received signal into that receivable by the flat panel display.

That is, the format converter 330 acts to convert input signals of various formats into output signals of a fixed format of, typically about 60 Hz.

Generally, a clock signal is inputted to the format converter 330 synchronously with input data and used as a reference clock signal of an internal circuitry of the format converter 330. Alternatively, a clock signal from an external oscillator may be inputted as the reference clock signal of the format converter.

Figure 4:
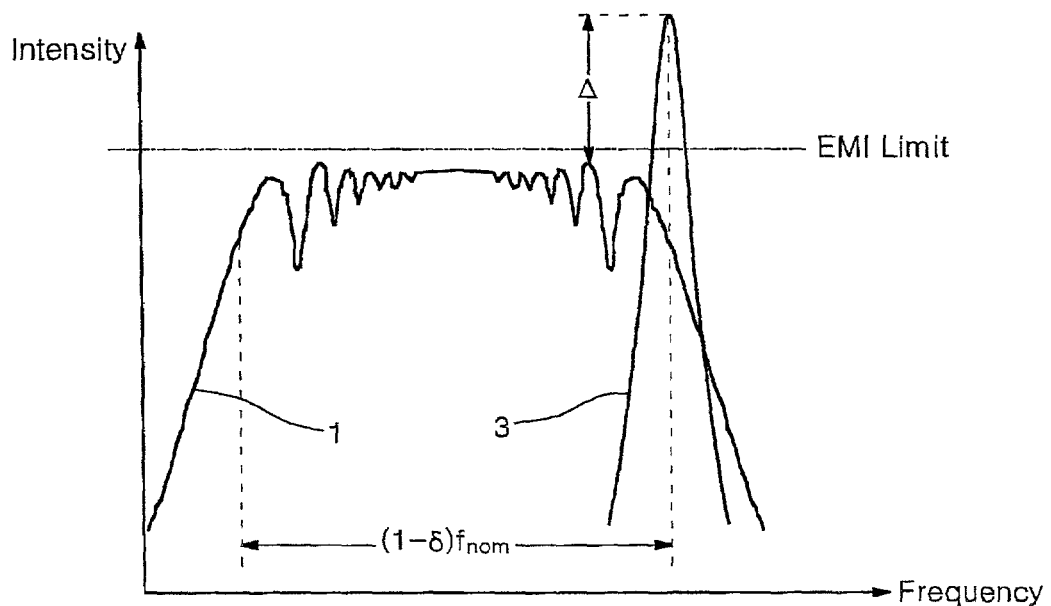
FIG. 4 is a, view showing an energy distribution of an EMI spectrum according to the present invention and a conventional EMI spectrum energy distribution.

The frequency-modulated clock signal from the PLL 331 is generated according to the spread spectrum clocking scheme and then outputted with data synchronously therewith FIG. 4 shows an energy distribution of an EMI spectrum according to the present invention and a conventional EMI spectrum energy distribution.

As seen from. FIG. 4, an output signal from the format converter, not modulated because it was not passed through the SSC unit 330, has a spectrum energy distribution 3 with an amplitude above an EMI limit causing EMI.

However, a clock signal generated by the EMI prevention apparatus for the flat panel display according to the present invention, namely, an output signal from the format converter, modulated by the SSC unit 330, has a spectrum energy distribution 1 with an amplitude below the EMI limit causing EMI.

In FIG. 4, an EMI decrement Δ is determined according to an energy distribution shape of a clock spectrum based on the spread spectrum clocking and a modulated amount δ. The energy distribution shape of the clock spectrum is also determined according to the modulation profile.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electromagnetic interference prevention apparatus for a flat panel display comprising:
   clock generation means for generating a reference clock signal;
   spread spectrum clocking means for modulating the reference clock signal generated by said clock generation means such that the reference clock signal is frequency modulated between a nominal frequency (fnom) of the reference clock signal and a down-spreading frequency (1-δ)fnom, where δ represents a spreading magnitude as a percentage of the nominal frequency (fnom), a frequency of said clock signal generated by said clock generation means being modulated according to a modulation profile to reduce an amplitude thereof, said modulation profile having a predetermined frequency; and
   data processing means for synchronizing the clock signal modulated by said spread spectrum clocking means with an input clock signal at the predetermined frequency and outputting input data as a signal of the predetermined frequency,
   wherein said data processing means is a format converter being adapted to receive the modulated clock signal from said spread spectrum clocking means as a reference clock signal for a phase lock loop therein and output a modified clock signal synchronized with input data.

2. The electromagnetic interference prevention apparatus as set forth in claim 1, wherein said clock generation means is an external oscillator.

3. The electromagnetic interference prevention apparatus as set forth in claim 1, wherein said data processing means is a format converter including a phase lock loop.

4. An electromagnetic interference prevention apparatus for a flat panel display comprising:
   clock generation means for generating a reference clock signal;
   spread spectrum clocking means for receiving the reference clock signal generated by said clock generation means and modulating a frequency of the received reference clock signal according to a modulation profile of a predetermined frequency to reduce an amplitude thereof, the modulation producing a modulated clock signal having a bandwidth substantially equal to (1-δ)fnom, where fnom is a nominal frequency of the reference clock signal and δ represents a spreading magnitude as a percentage of the nominal frequency (fnom); and
   data processing means for receiving the modulated clock signal from said spread spectrum clocking means and performing a predetermined data process in response to the received clock signal, said data processing means being a format converter being adapted to receive the modulated clock signal from said spread spectrum clocking means as a reference clock signal for a phase lock loop therein and output a modified clock signal synchronized with input data.

5. The electromagnetic interference prevention apparatus as set forth in claim 4, wherein said clock generation means is an external oscillator.

6. An electromagnetic interference prevention apparatus for a flat panel display comprising:
   clock generation means for generating a reference clock signal;
   spread spectrum clocking means for modulating the clock signal generated by said clock generation means such that the reference clock signal is frequency modulated between a nominal frequency (fnom) of the reference clock signal and a down-spreading frequency (1-δ) fnom, where δ represents a spreading magnitude as a percentage of the nominal frequency (fnom), a frequency of said clock signal being modulated according to a modulation profile of a predetermined frequency to reduce an amplitude thereof; and
   data processing means for receiving the clock signal modulated by said spread spectrum clocking means and performing a predetermined data process in response to the received clock signal, said data processing means being a format converter including a phase lock loop for synchronizing said clock signal modulated by said spread spectrum clocking means with an input clock signal at a predetermined frequency and outputting input data as a signal of the predetermined frequency.

7. The electromagnetic interference prevention apparatus as set forth in claim 6, wherein said clock generation means is an external oscillator.

8. An electromagnetic interference prevention apparatus for a panel display comprising:
   a clock generator configured to generate a reference clock signal;

a spread spectrum clocking circuit configured to modulate the reference clock signal between a nominal frequency (fnom) of the reference clock signal and a down-spreading frequency (1-δ)fnom, where δ represents a spreading magnitude as a percentage of the nominal frequency (fnom), so a highest amplitude of the modulated clock signal is below a predetermined Electromagnetic Interference (EMI) limit causing EMI to the panel display, a frequency of the reference clock signal being modulated according to a modulation profile having a predetermined frequency to reduce an amplitude thereof; and a data processor configured to synchronize the clock signal modulated by said spread spectrum clocking circuit with an input clock signal at a predetermined frequency and to output the synchronized signal, said data processor being a format converter being adapted to receive the modulated clock signal from said spread spectrum clocking means as a reference clock signal for a phase lock loop therein and output a modified clock signal synchronized with input data.

9. The apparatus as set forth in claim 8, wherein the clock generator is an external oscillator.

* * * * *